United States Patent
Maier (10) Patent No.: US 9,351,385 B2
(45) Date of Patent: May 24, 2016

(54) CIRCUIT ARRANGEMENT FOR PROTECTION FROM ELECTROSTATIC DISCHARGES AND METHOD FOR OPERATING SAME

(75) Inventor: Dieter Maier, Ludmannsdorf (AT)

(73) Assignee: ams AG, Unterpremst aetten (AT)

( * ) Notice: Subject to any disclaimer, the term of this patent is extended or adjusted under 35 U.S.C. 154(b) by 1442 days.

(21) Appl. No.: 12/675,833

(22) PCT Filed: Aug. 22, 2008

(86) PCT No.: PCT/EP2008/061035
§ 371 (c)(1),
(2), (4) Date: Sep. 22, 2010

(87) PCT Pub. No.: WO2009/027348
PCT Pub. Date: Mar. 5, 2009

(65) Prior Publication Data
US 2011/0110004 A1 May 12, 2011

(30) Foreign Application Priority Data

Aug. 29, 2007 (DE) .......................... 10 2007 040 875

(51) Int. Cl.
*H02H 9/00* (2006.01)
*H05F 3/00* (2006.01)
*H01L 27/02* (2006.01)
*H01L 23/60* (2006.01)
*H01L 23/62* (2006.01)
*H03K 17/0812* (2006.01)
(Continued)

(52) U.S. Cl.
CPC *H05F 3/00* (2013.01); *H01L 23/60* (2013.01); *H01L 23/62* (2013.01); *H01L 24/06* (2013.01); *H01L 27/0248* (2013.01); *H01L 27/0259* (2013.01); *H03K 17/0812* (2013.01); *H03K 17/0814* (2013.01); *H03K 17/30* (2013.01); *H01L 2924/12035* (2013.01); *H01L 2924/1301* (2013.01); *H01L 2924/1305* (2013.01); *H01L 2924/1306* (2013.01); *H01L 2924/13034* (2013.01); *H02H 9/048* (2013.01); *H03K 17/60* (2013.01); *H03K 17/687* (2013.01); *H03K 17/72* (2013.01); *H03K 17/74* (2013.01)

(58) Field of Classification Search
USPC .......................................................... 361/56
See application file for complete search history.

(56) References Cited

U.S. PATENT DOCUMENTS 4,975,798 A * 12/1990 Edwards et al. ................ 361/56
5,986,862 A 11/1999 Kim
(Continued)

FOREIGN PATENT DOCUMENTS

DE 197 40 949 7/1998
DE 10 2004 029 008 1/2006
(Continued)

*Primary Examiner* — Stephen W Jackson
*Assistant Examiner* — Ann Hoang
(74) *Attorney, Agent, or Firm* — McDermott Will & Emery LLP (57) ABSTRACT

A circuit arrangement for protection against electrostatic discharges has a diverting structure (ESD1), which comprises a diverting element (DE1) and a switchable element (SW1). The diverting element (DE1) is set up to drain off an electrostatic discharge between a first and a second terminal (K1, K2). The switchable element (SW1) can take a first and a second switching state, where a function of the diverting element (DE1) can be activated depending on the switching state of the switchable element (SW1).

11 Claims, 5 Drawing Sheets

(51) Int. Cl.
*H03K 17/0814* (2006.01)
*H03K 17/30* (2006.01)
*H01L 23/00* (2006.01)
*H02H 9/04* (2006.01)
*H03K 17/60* (2006.01)
*H03K 17/687* (2006.01)
*H03K 17/72* (2006.01)
*H03K 17/74* (2006.01)

(56) References Cited

U.S. PATENT DOCUMENTS

| | | | |
|---|---|---|---|
| 6,031,405 A * | 2/2000 | Yu | 327/313 |
| 6,040,733 A * | 3/2000 | Casper et al. | 327/525 |
| 6,327,125 B1 | 12/2001 | Colclaser et al. | |
| 6,424,510 B1 | 7/2002 | Ajit et al. | |
| 6,566,911 B1 * | 5/2003 | Moyer | 326/83 |
| 6,654,304 B1 | 11/2003 | Huang | |
| 6,690,557 B2 | 2/2004 | Hung et al. | |
| 6,728,086 B2 * | 4/2004 | Hung et al. | 361/56 |
| 7,295,411 B2 * | 11/2007 | Arai et al. | 361/56 |
| 2004/0100745 A1 | 5/2004 | Chen et al. | |
| 2004/0125521 A1 | 7/2004 | Salling et al. | |
| 2004/0190208 A1 | 9/2004 | Levit | |
| 2005/0111150 A1 * | 5/2005 | Jang et al. | 361/56 |
| 2006/0087781 A1 * | 4/2006 | Ishizuka et al. | 361/56 |
| 2008/0285199 A1 * | 11/2008 | Deutschmann et al. | 361/111 |

FOREIGN PATENT DOCUMENTS

| | | |
|---|---|---|
| EP | 1 879 229 | 1/2008 |
| WO | WO 01/47017 | 6/2001 |
| WO | WO 02/075892 | 9/2002 |
| WO | WO 2005/124863 | 12/2005 |

* cited by examiner

CIRCUIT ARRANGEMENT FOR PROTECTION FROM ELECTROSTATIC DISCHARGES AND METHOD FOR OPERATING SAME

RELATED APPLICATIONS

This is a U.S. national stage of application No. PCT/EP2008/061035, filed on Aug. 22, 2008.

This application claims the priority of German application no. 10 2007 040 875.9 filed Aug. 29, 2007, the entire content of which is hereby incorporated by reference.

FIELD OF THE INVENTION

The invention concerns a circuit arrangement for protection against electrostatic discharges and a method for operating such a circuit arrangement.

BACKGROUND OF THE INVENTION

When there are electrostatic discharges (ESD), high voltages occur, for example between the terminals of an electric circuit. This can lead to high currents through the circuit. Particularly with integrated circuits, the circuit could be destroyed by this.

To protect a circuit against electrostatic discharges it is possible to provide circuit arrangements that can drain off a current if there is an electrostatic discharge, thus protecting the electric circuit from damage if a high voltage occurs.

In such circuit arrangements it is possible to use various types of diverting elements, which are in each case connected between the terminals of the circuit or a component that is to be protected. The various types differ, among other things, in their voltage-current characteristic curves, and accordingly can have different protective behaviors.

Figure 14:
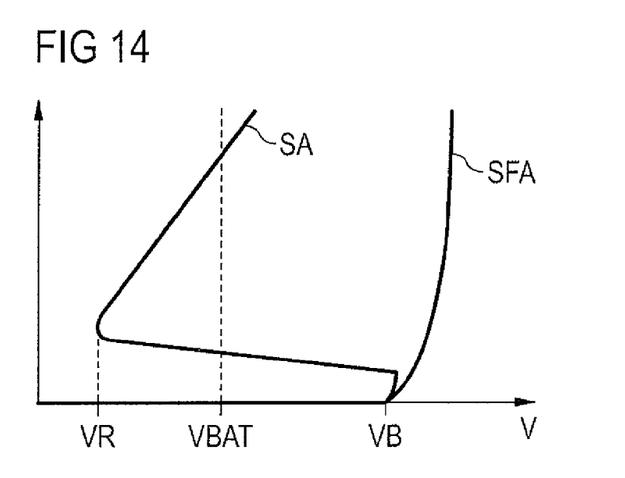
FIG. 14 shows an exemplary voltage-current diagram for different diverting elements.

FIG. 14 shows an example of a voltage-current diagram with the voltage-current characteristic curves of different diverting elements, which here are represented as so-called transmission line pulsing (TLP) curves. For example, a first type of diverting element has the characteristic curve SFA, which has the form of a diode characteristic with breakdown voltage VB. The characteristic curve SFA does not have a voltage snapback. In contrast, a second example of a diverting element is determined by the characteristic curve SA, which has snapback from the breakdown voltage VB to a snapback voltage VR.

Protection of the circuit or component may additionally be necessary in various operating states. For example, a component in uninstalled state should be protected, for example against a discharge due to an electrostatic charge transferred to the component by contact and/or static electricity due to friction. Such protection in which a component in uninstalled state is protected can also be called chip-level protection. Moreover, it may be necessary to protect a component from overvoltages that occur at terminals of the component when it is installed in a circuit and/or when it is operated together with a circuit. Such overvoltages can occurs, for example, due to undesired transient processes, for instance at power supply lines or because of electrostatic discharges. Protection of a component in installed state or during the operation of the component can also be called system-level protection.

Accordingly, protective elements or protective structures for protection against electrostatic discharges can basically be better suited for one of several possible protective applications. Referring to the diagram in FIG. 14, for example, with a protective element having a characteristic curve corresponding to curve SA, the protective element, when operated at a supply voltage or a battery voltage VBAT, may become damaged if there is an overvoltage that is to be drained off. If, for example, a voltage between the terminals to be protected is higher than the breakdown voltage VB, the protective element is triggered, which initially causes a snapback to the snapback voltage VR. If, as in this example, the battery voltage is higher than the snapback voltage VR, the protective element is, however, no longer in a nonconducting state, but rather there will be a current increase up to a value that corresponds to the battery voltage VBAT. As a rule, this current will be higher than the permissible continuous current of the protective element, which in the end can lead to damage to the protective element.

Such a damaged protective element may effect a permanently conducting connection between the terminals to be protected. As a consequence, the device to be protected or the circuit to be protected possibly can no longer be used.

If protective elements with a snapback-free curve corresponding to curve SFA in FIG. 14 are used, as a rule, a considerably larger area is required on a semiconductor chip than in the case of a protective element with a curve corresponding to curve SA. This leads to higher cost and/or a larger circuit in the production of a component with a corresponding protective element. As a rule, this also involves higher costs.

SUMMARY OF THE INVENTION

It is a problem of the invention to specify a circuit arrangement for protection against electrostatic discharges with which a circuit that is to be protected can be operated in various operating states reliably and with low cost. It is also a problem of the invention to specify a method for operating such a circuit arrangement that can be realized at low cost.

In an embodiment example, a circuit arrangement for protection against electrostatic discharges has a first diverting structure. The first diverting structure comprises a first diverting element, which is designed to drain off an electrostatic discharge between a first and a second terminal, and a first switchable element, which can take a first and a second switching state. The function of draining off of the electrostatic discharge of the first diverting element is activated by the first switching state of the first switchable element and deactivated by the second switching state of the first switchable element. In other words, a function of the first diverting element can be activated depending on the switching state of the first switchable element. In addition, a second diverting structure with a second diverting element, which again connects the first and second terminals together, is to be provided. The second diverting element is made, for example, as an element with a voltage-current characteristic curve that does not have voltage snapback.

Therefore, a function, in particularly a protection function of the first diverting element, can be activated for the case when the first diverting element is suitable for a relevant operating state of the circuit that is to be protected. Accordingly, the function of the first diverting element can also be intentionally deactivated. For example, this can prevent a triggering of the first diverting element leading to damage of the diverting element and to an adverse effect on the functioning of the circuit to be protected. Therefore, both the protection and the functioning of a circuit to be protected can be guaranteed for different operating states, for example chip-level protection and/or system-level protection. Activation or deactivation of the first diverting element takes place in accordance with an altered switching state of the switchable element. Consequently, the cost for providing the circuit arrangement and for the operation of the circuit arrangement is low.

For example, the second diverting element is likewise set up to drain off an electrostatic charge between the first and the second terminal, in particular for an operating state in which a function of the first diverting element is deactivated. In this case, for example, the first diverting element is suitable for chip-level protection and the second diverting element is suitable for system-level protection.

For example, the diverting element can be designed as an element with a voltage-current characteristic that has voltage snapback. To prevent damage to the diverting element for the case when the circuit arrangement is operated with a voltage that is higher than the snapback voltage of the diverting element, the diverting element can, for example, be connected in a series circuit with the switchable element of the first and second terminal, whereby the switchable element is in a non-conducting state when an operating voltage is applied. Thus, the function of the diverting element is also not active.

The switchable element in this case can be designed as a switch or multiply switchable element, or alternatively as a one-time switchable or irreversibly switchable element. In one embodiment example the switchable element is a fuse, which becomes damaged in the case of too high a current through the diverting element and the fuse, and with that prevents the further flow of current through the diverting element that could lead to damage to the diverting element.

Optionally, a second diverting structure with a second diverting element that again connects the first and second terminals together can also be provided. For example, the second diverting element is set up to drain off an electrostatic discharge between the first and second terminal, in particular for an operating state in which a function of the first diverting element is deactivated. The second diverting element is designed for this, for example, as an element with a voltage-current characteristic that does not have voltage snapback. In this case, for example, the first diverting element is suitable for chip-level protection and the second diverting element for system-level protection.

In another embodiment, a first and a second diverting element are each connected in a series circuit with a switchable element between the first and the second terminal. The first and second diverting elements in this case are preferably set up to drain off electrostatic discharges, each in different operating states, for example the first diverting element is provided for chip-level protection and the second diverting element for system-level protection. In addition, a control circuit is provided, which, by controlling the switchable elements, activates in each case one of the diverting elements from among of the first and second diverting elements and that in each case deactivates the other diverting element from the said elements. The activation or deactivation in this case takes place, for example, in accordance with an operating state established by the control circuit.

The one-time switchable element or fuse can be destroyed, for example, if a protection operation occurs due to an appropriate current flow. Alternatively, depending on the control signal a current flow through the one time-switchable element can be produced that leads to destruction of the switchable element, thus to separation of the conducting connection through the switchable element.

In another embodiment example, a circuit arrangement for protection against electrostatic discharges has a diverting structure. This diverting structure comprises a diverting element that is set up to drain off an electrostatic discharge between a first and a second terminal. In addition, in the circuit arrangement there are provided a first and a second trigger element, which issue trigger signals that are suitable for controlling a diverting element. In particular, the first trigger element is set up to issue a first trigger signal in accordance with a preset voltage increase between the first and second terminal. The second trigger element is set up to issue a second trigger signal in accordance with a preset threshold voltage between the first and second terminal. The diverting element is set up to connect the first and second terminals in accordance with the first and/or the second trigger signal. Accordingly, the first and second trigger elements are preferably designed for different operating states, for example again for chip-level protection and system-level protection. Via a control circuit and appropriately arranged switchable elements, a function of the first and second trigger elements can in each case be activated or deactivated. Thus, depending on an established operating state an appropriate triggering of the protection can take place, so that an undesired or unnecessary triggering of the diverting element can be prevented.

In one embodiment example of a method for operating a circuit arrangement for protecting against electrostatic discharges, the circuit arrangement is provided with a first and a second diverting element, which are set up to drain off an electrostatic discharge between a first and a second terminal. In this case a draining off function of the second diverting element is permanently activated or becomes activated or deactivated in accordance with an activation state of the protection function of the first diverting element. The operating state of the circuit arrangement is determined, and a protection function of the first diverting element is activated and/or deactivated in accordance with the determined operating state.

For example, the activation and/or the deactivation takes place via a switchable element that connects the first terminal to the second terminal in a series circuit with the first diverting element. Deactivation of a protection function of the first diverting element in this case can take place irreversibly.

In another embodiment example of the method, again a circuit arrangement is provided with a first and a second diverting element, which are set up to drain off an electrostatic discharge between a first and a second terminal. A first trigger signal is generated in accordance with a preset voltage rise between a first and a second terminal. In addition, a second trigger signal is generated in accordance with a preset threshold voltage between the first and the second terminal. The operating state of the circuit arrangement is determined. The first trigger signal is transmitted if a first operating state is determined in the determination of the operating state and the second trigger signal is transmitted if a second operating state is determined in the determination of the operating state. The diverting element is controlled with the transmitted trigger signal.

In the relevant embodiment examples of the method, an average potential difference between the first and second terminal can be evaluated in the determination of the operating state.

The various embodiment forms are based on the common idea of guaranteeing a matched protection against electrostatic discharges in various operating situations, in particular in a system-level operating state and in a chip-level operating state. In other words, electrostatic discharges that originate from different causes can be drained off with the described embodiment forms.

BRIEF DESCRIPTION OF THE DRAWINGS

In what follows, the invention will be explained in detail by means of embodiment examples with reference to the drawings. Elements with like function or activity have the same reference numbers.

DETAILED DESCRIPTION OF THE DRAWINGS

Figure 1:
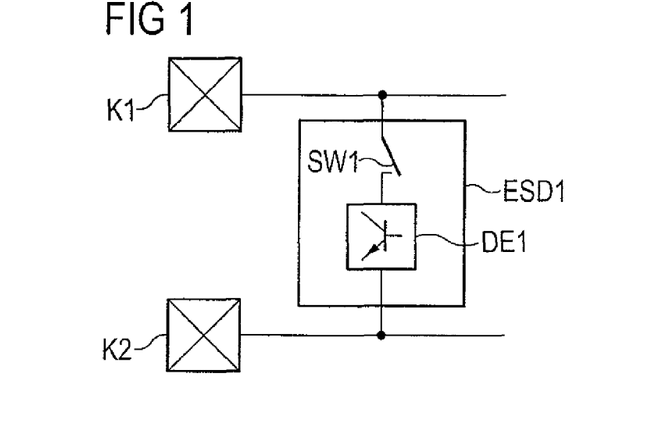
FIG. 1 shows a first embodiment example of a circuit arrangement for protection against electrostatic discharges.

FIG. 1 shows an embodiment example of a circuit arrangement for protection against electrostatic discharges with a diverting structure ESD1, which is connected between a first and a second terminal K1 and K2. The diverting structure ESD1 comprises a first diverting element DE1, which is represented symbolically in FIG. 1 by a transistor. The diverting structure ESD1 additionally comprises a switchable element SW1, which can take a first and a second switching state. The diverting element DE1 is set up to drain off an electrostatic discharge between the first and the second terminal K1 and K2. Here a function, in particular a diverting function of the diverting element DE1, depends on the switching state of the switchable element SW1. In addition to a semiconductor element that can drain off electrostatic discharges, the diverting element DE1 can also have one or more trigger devices that control a protection operation via a diverting element DE1.

In various embodiment examples, the switchable element SW1 can be intended to drain off an electrostatic discharge between the first and second terminal K1 and K2 directly in one possible current path, so that if switchable element SW1 is in an open, nonconducting state, a protection function is deactivated. In other embodiment examples, the function of one or more trigger elements is also controlled, in particular, activated or deactivated by the switchable element SW1.

Figure 2:
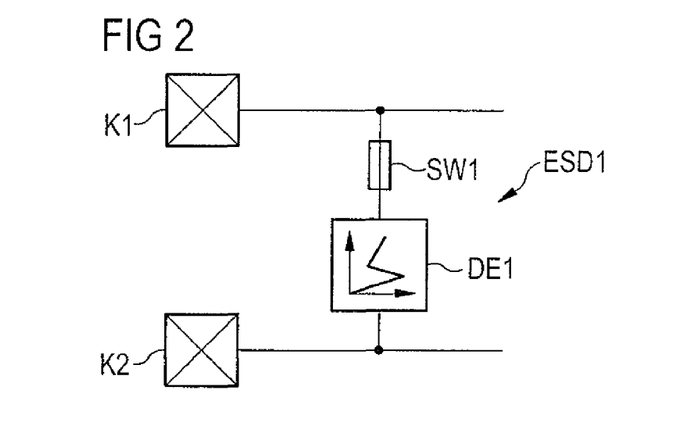
FIG. 2 shows a second embodiment example of a circuit arrangement for protection against electrostatic discharges.

FIG. 2 shows another embodiment example of a circuit arrangement for protection against electrostatic discharges in which the diverting element connects the first terminal K1 to the second terminal K2 in a series circuit with the switchable element SW1. The switchable element SW1 in this embodiment example is designed as a one-time-switchable or irreversibly switchable element. For example, the one-time-switchable element comprises a fuse.

The diverting element DE1 comprises, for example, an NPN transistor or an n-channel field effect transistor. Alternatively, the diverting element could also comprise a thyristor or a silicon-controlled rectifier (SCR). In another embodiment example, the diverting element DE1 can also comprise an element with a voltage-current characteristic that has voltage snapback. This is symbolically represented in FIG. 2 by the characteristic curve of the diverting element DE1. The diverting element DE1 has, for example, a characteristic that corresponds to the characteristic SA in the diagram in FIG. 14.

If the circuit arrangement is operated with a circuit connected to terminals K1 and K2 that is connected to a supply voltage that is greater than a snapback voltage VR of the diverting element DE1, if diverting element DE1 is triggered there could be current flow that leads or would lead to damage to diverting element DE1. Such current, which results not only from the ESD load, but also from the voltage difference between the supply voltage and the withstand voltage of diverting element DE1, also, however, causes burnout of the one-time switchable element SW1, due to which current flow is interrupted. In this case the diverting element DE1 itself can remain undamaged. In particular, damage to the diverting element DE1 does not occur since the first and second terminals K1 and K2 are not permanently electrically connected together. The circuit connected to terminals K1 and K2 thus continues to be functional. However, a permanent electrical connection of the first and second terminals K1 and K2 is effectively avoided even if the diverting element DE1 is destroyed since the switchable element SW1 is not conducting.

Diverting elements having a current-voltage characteristic with voltage snapback are especially suitable for protecting a circuit against electrostatic discharges that are produced by contact and static electricity. Such protection is especially meaningful for components that are not yet incorporated into a circuit or are not yet operated with such a circuit, and can also be called chip-level protection. Through the burnout or opening of the one-time switchable element SW1, the circuit to be protected can be protected against electrostatic discharges in the uninstalled state. However, since the loss of protection occurs when the component is installed, the loss of protection may be unimportant.

Figure 3:
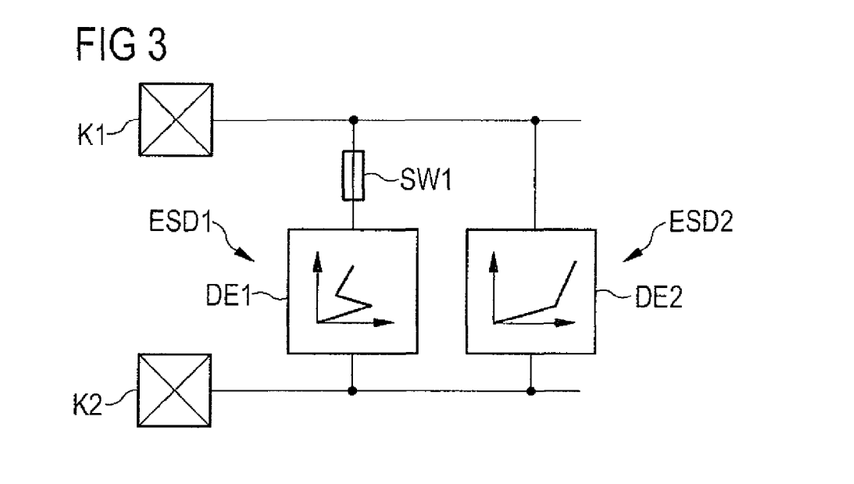
FIG. 3 shows a third embodiment example of a circuit arrangement for protection against electrostatic discharges.

However, in order to be able to drain off even electrostatic discharges during the operation of a circuit, which corresponds to system-level protection, another embodiment example shown in FIG. 3 features is a second diverting structure ESD2 with a second diverting element DE2, where the second diverting element DE2 connects the first terminal K1 to the second terminal K2. The second diverting element DE2 comprises, for example, a PNP transistor or a P-channel field effect transistor or a Zener diode. In other words, the second diverting element DE2 can comprise an element with a voltage-current characteristic that does not have snapback. Such an element is particularly suitable for system-level protection against electrostatic discharges during the operation of a connected circuit that is to be protected.

As described above for the embodiment example in FIG. 2, if the first diverting element DE1 is triggered, destruction of the first switchable element designed as a safety device can occur if an operating voltage at terminals K1 and K2 is higher than the snapback voltage VR of the first diverting element DE1. However, protection against electrostatic discharges is additionally guaranteed by the second diverting structure ESD2. In other words, after destruction of protection SW1 there still remains ESD protection of a circuit to be protected even if a protection function of the first diverting element DE1 is deactivated.

Figure 4:
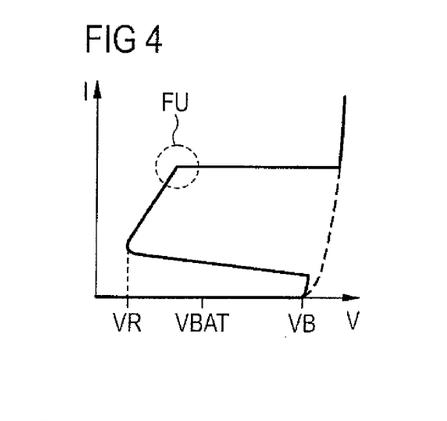
FIG. 4 shows an exemplary voltage-current diagram.

FIG. 4 shows an exemplary voltage-current diagram during the occurrence of an electrostatic discharge, at the beginning of which both the first and the second diverting elements DE1 and DE2, in accordance with the embodiment example in FIG. 3, are activated. Here, there is first voltage snapback via the first diverting element DE1 and a subsequent rise of voltage in current through the first diverting element DE1. In the region indicated by FU there is destruction of the safety device SW1, where the first diverting element DE1 can also be destroyed. Accordingly, farther drainage of the electrostatic discharge can take place via the second diverting element DE2, whose characteristic is shown with a broken line. After this operation, which is irreversible as a rule, further drainage of electrostatic discharges takes place only via the second diverting element DE2.

Figure 5:
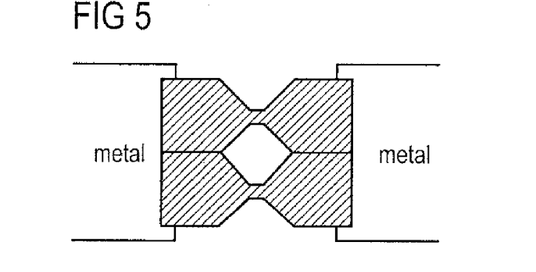
FIG. 5 shows an embodiment example of a fuse.

FIG. 5 shows an embodiment example of a fuse that can be used as switchable element SW1 in one of the embodiment examples that are shown. Such a fuse can be realized, for example, in the layout of a semiconductor circuit. If there is a corresponding current load on the fuse, the narrow points in the shaded region of the fuse come apart because of the high current, so that then there is no electrical connection between the two metal regions shown.

In the embodiment examples shown in FIGS. 2 and 3, the switchable element or safety device SW1 can be destroyed or opened by the occurrence of an electrostatic discharge. In the embodiment examples shown in FIG. 6A, a bypass circuit BR designed as a transistor, which is connected in parallel with the first diverting element DE1, is provided. Transistor BR has a control terminal BL via which a control signal can be delivered.

Figure 6A:
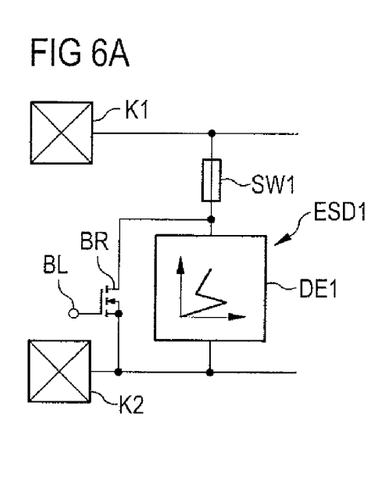
FIG. 6A shows a fourth embodiment example of a circuit arrangement for protection against electrostatic discharges.

Depending on the control signal, the controlled paths of transistors BR can thus be connected in a conducting state, through which the first and second terminals K1 and K2 are connected via the first switchable element SW1. If there is an appropriate voltage between terminals K1 and K2, there will correspondingly be current flow through safety device SW1, which destroys safety device SW1 and thus deactivates the protection function of the first diverting element DE1. The first diverting element DE1 itself is not destroyed. The control signal at control input BL can be generated by means of appropriate detection devices such as a power-on-reset (POR), an overvoltage detection circuit, an EPROM circuit, or directly from a digital core of an integrated circuit to be protected.

Figure 6B:
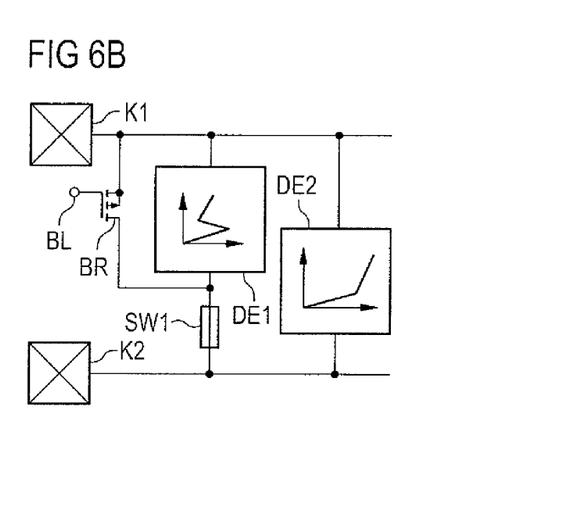
FIG. 6B shows a fifth embodiment example of a circuit arrangement for protection against electrostatic discharges.

FIG. 6B shows another embodiment example of a circuit arrangement for protection against electrostatic discharges, in which, in contrast to the embodiment example in FIG. 6A, the first diverting element DE1 and the safety device SW1 are exchanged with each other. Moreover, similar to the embodiment example in FIG. 3, a second diverting element DE2 is provided between the first and second terminal K1 and K2. Thus, again a protection function against electrostatic discharges is guaranteed, even if the first diverting element DE1 is disconnected as a result of destruction of safety device SW1 or its function is deactivated. The second diverting element DE2 is permanently activated with regard to its protection function, both in this embodiment example and in the embodiment example in FIG. 3.

Figure 7:
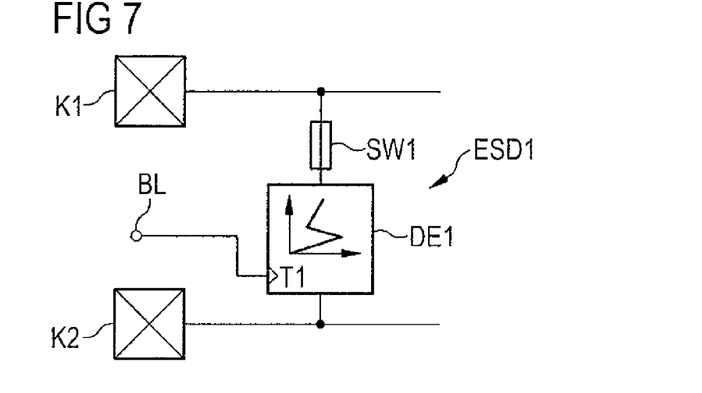
FIG. 7 shows a sixth embodiment example of a circuit arrangement for protection against electrostatic discharges.

FIG. 7 shows another embodiment example of a circuit arrangement for protection against electrostatic discharges, in which the first diverting element DE1 has a control input T1 for feed of a control signal, in accordance with which the conduction of the first diverting element DE1 can be controlled. The control input T1 is connected to the control terminal BL for feed of the control signal.

The diverting element DE1 is actively triggered during operation by the control signal. At the corresponding voltages on terminals K1 and K2, a current flows through the series-connected safety device SW1 that is so large that SW1 burns out. For example, thyristors, particularly the so-called silicon-controlled rectifiers (SCR), turn-on bigFET diverting elements or other active turn-on diverting elements with and without snapback can be used as actively triggerable diverting elements.

In another embodiment example, a second diverting element DE2 can be connected in parallel with the circuit shown in FIG. 7, for example as in the embodiment example in FIG. 3.

Figure 8:
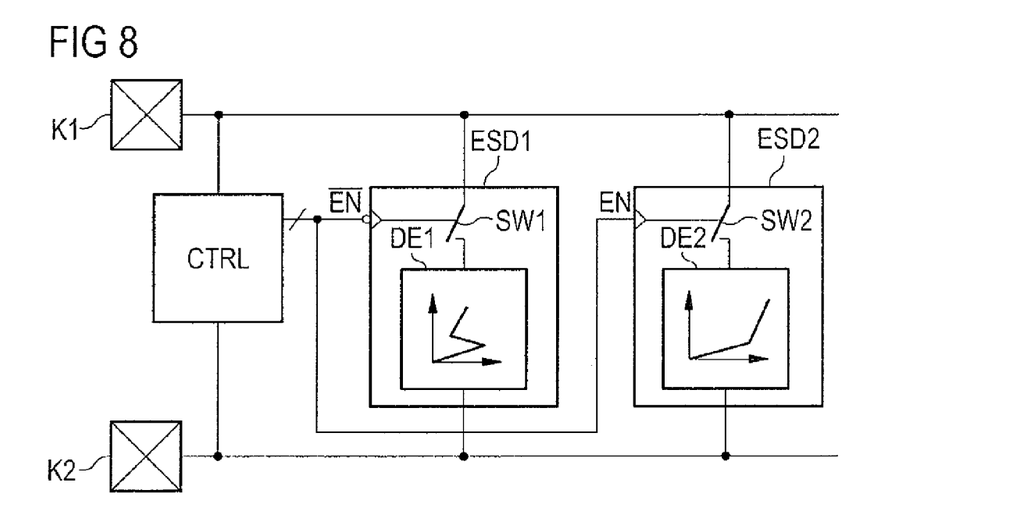
FIG. 8 shows a seventh embodiment example of a circuit arrangement for protection against electrostatic discharges.

As explained above, for different operating states of a circuit that is to be protected, different diverting elements with different protection characteristics can be used, each of which is matched to one of the intended operating states. FIG. 8 shows an embodiment example of a circuit arrangement for protection against electrostatic discharges, in which arrangement a first and a second diverting structure ESD1 and ESD2 are connected between the first and second terminals K1 and K2. The first diverting structure ESD1 in this case has a series circuit of a first switchable element SW1 and a first diverting element DE1, which preferably comprises an element with a voltage-current characteristic that has voltage snapback. The second diverting element ESD2 accordingly comprises a series circuit of a second diverting element DE2 and a second switchable element SW2, whereby the second diverting element DE2 preferably comprises an element with a voltage-current characteristic that does not have snapback. The first and second terminals K1 and K2 are each connected via the series circuit of the switchable elements SW1 and SW2 and the diverting elements DE1 and DE2. The circuit arrangement additionally has a control circuit CTRL, which is connected to the first and second terminals and has a control output, which is connected to the first and second switchable elements SW1 and SW2 for control.

The control circuit CTRL is set up to activate, via control of the first and second switchable elements SW1 and SW2 with the corresponding activation signals EN, $\overline{\text{EN}}$, one diverting element each from among of the first and second diverting elements DE1 and DE2, and to deactivate the relevant other diverting element from said elements.

The control circuit comprises, for example, a detection circuit for determining an operating state of the circuit arrangement or the circuit to be protected. Such a detection circuit comprises, for example, a power-on-reset (POR switch), a poly-fuse, an EPROM or other comparable circuit. For example, an average potential difference between the first and second terminals K1 and K2 is evaluated through the control circuit CTRL.

The switchable elements SW1 and SW2 can be designed as one-time switchable elements, and in this case the first switchable element SW1 is switchable one time from a conducting to a nonconducting state and the second switchable element SW2 can be switched one time from a nonconducting state to a conducting state. In other words, the first diverting element DE1 can be deactivated once and the second diverting element DE2 can be activated once. This can, for example, be meaningful for the case when the first diverting element DE1 is intended for protection of a component in the uninstalled state, chip-level state, and the second diverting element DE2 is intended for protection of the component in the installed state, system-level state.

However, the first and second switchable elements SW1 and SW2 can also be designed as multiply switchable elements and can comprise, for example, a transmission gate or a p-channel field effect transistor or bipolar transistors. Therefore, it is possible even to guarantee protection of a component that is installed and uninstalled or put into operation and taken out of operation a number of times.

There are several possibilities for active triggering of ESD diverting elements. Various trigger elements can be used for this. The trigger properties of some of these trigger elements are better suited for chip-level ESD protection in which the component to be protected is to be protected, for example, from electrostatic discharges due to contact. On the other hand, the trigger properties of other trigger elements can be better suited for system-level ESD protection, which is intended to protect a component in the installed state and/or in the operation of the component.

For example, trigger elements can be set up to detect a rapid rise of voltage between terminals to be protected, in order to initiate, in accordance with this, a triggering, whereby the triggering is dependent on a specific rise time of the monitored signal at the terminals to be protected. Such triggering can be carried out, for example, with a trigger element that has an RC member for detection. A trigger element with an RC member accordingly can also be called an RC rise time trigger. However, transient disturbances occurring during normal operation or system-level operation at the protected terminals can initiate an undesired triggering.

A trigger element that is suitable for system-level protection is set up, for example, to detect the exceeding of a preset threshold voltage between the monitored terminals and to initiate triggering if the threshold voltage is exceeded. Usually such a trigger element does not respond if there are brief voltage peaks, and for this reason it is less suitable for chip-level protection.

Figure 9:
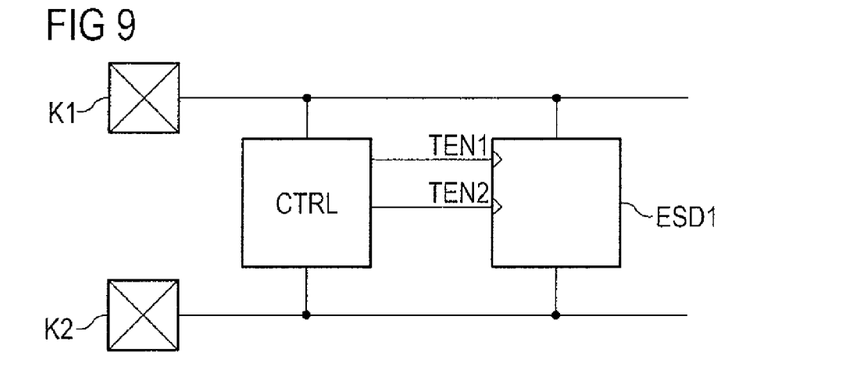
FIG. 9 shows an eighth embodiment example of a circuit arrangement for protection against electrostatic discharges.

FIG. 9 shows another embodiment example of a circuit arrangement for protection against electrostatic discharges, which has a diverting structure ESD1 with two control inputs for feed of a first and second control signal TEN1 and TEN2. The control signals TEN1 and TEN2 are issued by a control circuit CTRL.

The diverting structure ESD1 has, for example, a diverting element, a first trigger element, which is suitable for chip-level protection, and a second trigger element, which is suitable for system-level protection, not shown here for the sake of clarity. For example, the first trigger element can be activated or deactivated by the first control signal TEN1. Accordingly, the second trigger element can also be activated or deactivated by the second control signal TEN2. The control signal CTRL can thus activate the appropriate trigger element depending on the protection required, namely chip-level protection or system-level protection, and deactivate the other trigger element. In triggering the activated trigger element, the corresponding trigger signal is used to control the diverting element or is transmitted further on. In other words, the diverting element depends on the trigger signal for electrically connecting the first and the second terminals K1 and K2 in order to drain off the electrostatic discharge.

For example, the first trigger element is set up to issue a first trigger signal in accordance with a preset voltage rise between the first and second terminals K1 and K2, while the second trigger element is set up to issue a second trigger signal in accordance with the preset threshold voltage between the first and second terminals. The first and second trigger elements can each be activated or deactivated by a first and a second switchable element, whereby the switchable elements are controlled by control signals TEN1 and TEN2.

For a circuit arrangement in accordance with this embodiment example, it can be meaningful to use as the diverting element a PNP transistor, a p-channel field effect transistor, a Zener diode, or generally an element with a voltage-characteristic that does not have snapback. The operating state of the circuit to be protected can be determined, for example, by evaluating an average potential difference between the first and second terminals K1 and K2. Thus, by means of the average potential difference it can be determined if chip-level protection or system-level protection is needed.

Figure 10:
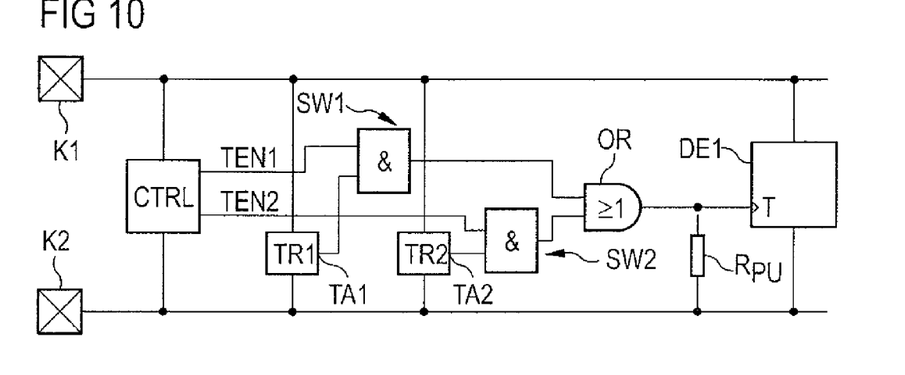
FIG. 10 shows a ninth embodiment example of a circuit arrangement for protection against electrostatic discharges.

FIG. 10 shows another embodiment example of such a circuit arrangement, which is based on the embodiment example in FIG. 9. The circuit arrangement comprises a first trigger element TR1 and a second trigger element TR2, each of which is electrically connected to the first and second terminals K1 and K2 for monitoring the potential conditions. Additionally provided are a first and a second switchable element SW1 and SW2, which in this embodiment example are designed as AND elements. In each case a first input of the AND elements SW1 and SW2 is set up to feed a corresponding control signal TEN1 or TEN2 from the control circuit CTRL, while a second input is connected to the corresponding trigger outputs TA1 and TA2 of the first and second trigger elements TR1 and TR2. The outputs of the AND elements SW1 and SW2 are connected to an OR element OR, the output of which is connected to a trigger input of the diverting element DE1. A resistor $R_{PU}$ connects the trigger input of the diverting element DE1 to the second terminal K2.

In a system-level operating state, the first control signal TEN1 is set to a logic LOW state, so that at the output of the first AND element SW1 there is likewise always LOW signal issued, independent of a first trigger signal issued at the first trigger output TA1. Correspondingly, the second control signal TEN2 is set to a high state, so that at the output of the second AND element SW2, a possible second trigger signal at the second trigger output TA2 is transmitted at the output side. Through the OR member OR, a passed-on trigger signal can be sent to the trigger input T of the diverting element DE1 in order to produce a conducting connection of terminals K1 and K2.

If, however, the control circuit CTRL detects a chip-level operating state, the first control signal TEN1 is set to a HIGH state and the second control signal TEN2 is set to a LOW state, so that a first trigger signal of the first trigger element TR1 can be transmitted, while a second trigger signal of the second trigger element TR2 is blocked by the second AND element SW2.

Figure 11:
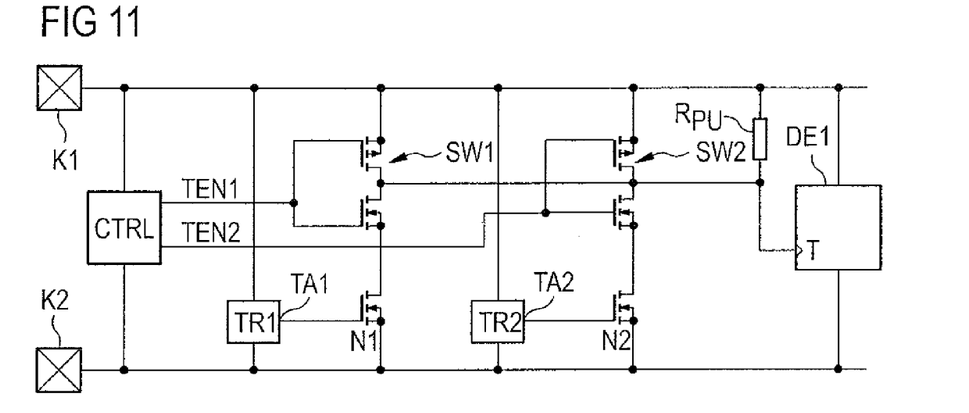
FIG. 11 shows a tenth embodiment example of a circuit arrangement for protection against electrostatic discharges.

FIG. 11 shows another embodiment example of a circuit arrangement based on the embodiment examples shown in FIG. 9. The first and second switchable elements SW1 and SW2 in this embodiment example are designed as inverters, to which the first and second control signals TEN1 and TEN2 are correspondingly delivered at the input side. The inverters SW1 and SW2 are each connected at one terminal to the first terminal K1 and at another terminal to the relevant transistor N1 and N2, the control input of which is connected to one of the trigger outputs TA1 and TA2. The outputs of the inverters SW1 and SW2 are connected to the trigger input T of the diverting element DE1.

The transistors N1 and N2 can be controlled by the corresponding trigger signals of the first and second trigger elements TR1 and TR2. In the case of a system-level operating state, the first control signal TE1 again is set to a LOW state, so that the output of the first switch element SW1 is pulled to the potential at the first terminal K1. With that, trigger signals cannot be transmitted to the diverting element DE1 via the first transistor N1. The first trigger device TR1 is correspondingly deactivated. At the same time in this case, the second control signal TEN2 again is set to a logic HIGH state, so that the second inverter SW2 is pulled downward, in the direction of the potential at the second terminal K2; the output potential of inverter SW2, however, remains at the potential of the first terminal K1 because of the resistor $R_{PU}$. As soon as the second transistor N2 is activated or controlled by a trigger signal at the trigger output TA2 of the second trigger element TR2, the potential at the output of the signal inverter SW2 is pulled to the position of the second terminal K2, so that triggering of the diverting element DE1 occurs.

Thus, the first trigger element TR1 is deactivated and the second trigger element TR2 is activated. With an appropriate switching of the logic states of the control signals TEN1 and TEN2, thus the first trigger element can be activated and the second trigger element TR2 deactivated, which corresponds to protection for a chip-level operating state.

Figure 12:
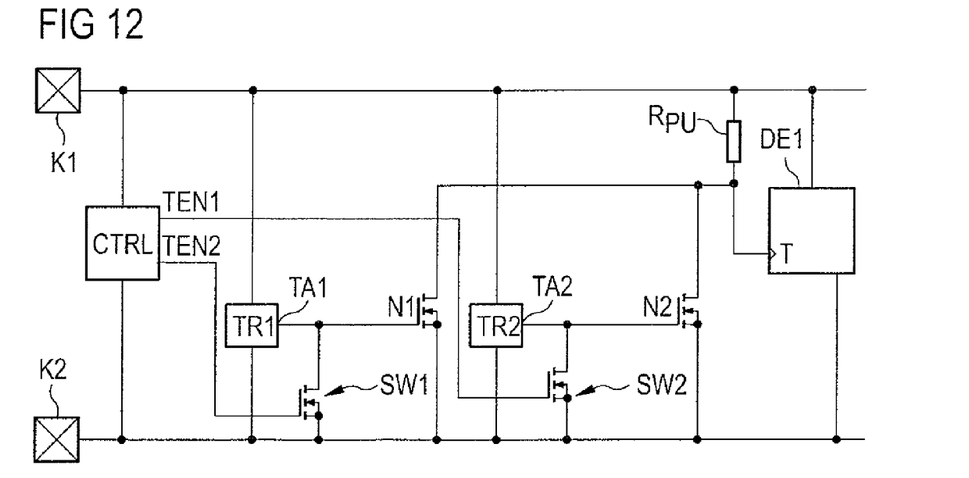
FIG. 12 shows an eleventh embodiment example of a circuit arrangement for protection against electrostatic discharges.

FIG. 12 shows an alternative embodiment example of a circuit arrangement that again is based on the embodiment example in FIG. 9. Switchable elements SW1 and SW2 that are designed as transistors are provided at the corresponding trigger outputs TA1 and TA2, and these connect the trigger outputs TA1 and TA2 to the second terminal K2. The first and second switchable elements SW1 and SW2 are controlled via the control signals TEN1 and TEN2. Depending on the switching state of the switchable elements SW1 and SW2, a relevant trigger signal of the first and second trigger elements TR1 and TR2 can be used to control n-channel field effect transistors N1 and N2, the outputs of which are connected to the trigger input T of the diverting element DE1. If one of the switchable elements SW1 and SW2 is in a conducting state, the potential at the control input of the corresponding transistor N1 or N2 is at the potential of the second terminal K2, so that control of the relevant transistor N1 or N2 is not possible. Activation or deactivation of the first and second trigger elements TR1 and TR2 thus takes place regardless of the switching state of the switchable elements SW1 and SW2. The transistors of the switchable elements SW1 and SW2 in this case can be designed for a small current load and therefore the space requirement in an integrated circuit is smaller.

Figure 13:
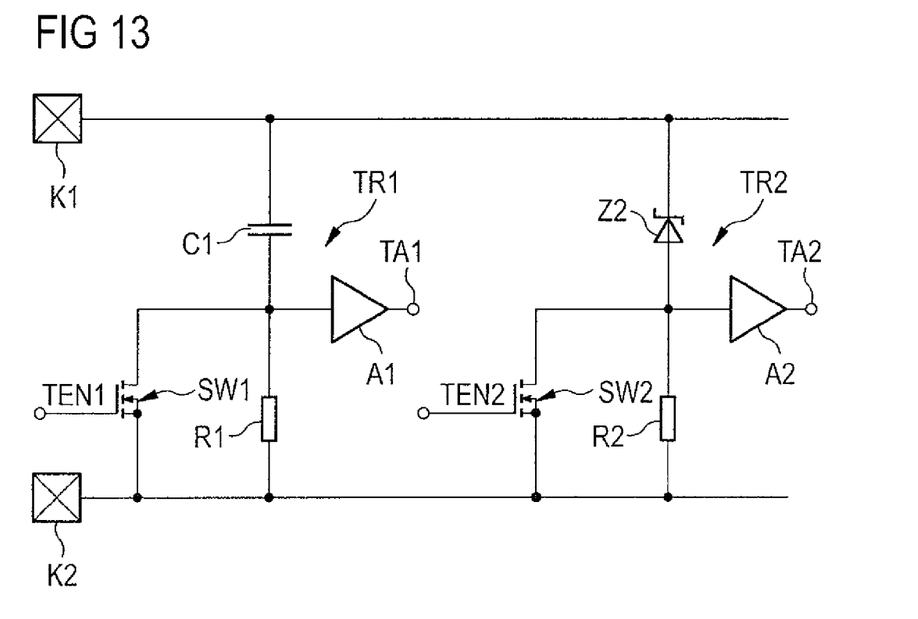
FIG. 13 shows an embodiment example of trigger elements.

FIG. 13 shows an embodiment example of trigger elements TR1 and TR2, which can be activated or deactivated by means of control signals TEN1 and TEN2 on the basis of the principle of the embodiment example shown in FIG. 9. The first trigger element TR1 comprises a series circuit of a capacitor C1 and a resistor R1 and an amplifier element A1, which is connected at the input side to the connection junction of resistor R1 and capacitor C1. One output of the amplifier element A1 forms the first trigger output TA1 or is connected to the first trigger output TA1. The second trigger element TR2 comprises a series circuit of a Zener diode Z2 and a resistor R2, which are connected between the first and second terminals K1 and K2. Similar to the first trigger element TR1, a second amplifier element A2 is connected at a connection junction of the Zener diode Z2 and resistor R2, its output forming the second trigger output TA2 or being connected to it.

The first trigger element TR1 is, via the RC series circuit of elements R1 and C1, suitable for detecting a preset voltage rise between the first and second terminals K1 and K2 and issuing a corresponding trigger signal. The first trigger element TR1 is for this reason especially suitable for a chip-level operating state. A duration of a voltage rise that is to be detected can take place, for example by appropriate dimensioning of capacitor C1 and/or resistor R1.

The second trigger element TR2 is, via the series circuit of Zener diode Z2 and resistor R2, suitable for issuing a second trigger signal in accordance with a preset threshold voltage between the first and second terminals. The threshold voltage here is determined in particular by the breakdown voltage of the Zener diode Z2. The second trigger element TR2 is therefore especially suitable for a system-level operating state in which the circuit arrangement is installed or put into operation.

A switchable element SW1 and SW2 designed as a transistor is provided in each case in parallel to resistors R1 and R2 of the first and second trigger elements TR1 and TR2, the element being controllable depending on the first or second control signal TEN1 or TEN2. The trigger outputs TA1 and TA2 are, for example, connected to a trigger input of a diverting element DE1, not shown here. Referring to FIG. 9, the control signals TEN1 and TEN2 can be made available from an appropriate control circuit CTRL.

In a HIGH state of one of the control signals TEN1 or TEN2, the corresponding switchable element SW1 or SW2 is controlled so that the relevant resistor R1 and R2 is bypassed. In this case dynamic control of the relevant trigger element TR1 or TR2 is no longer possible. Thus again, by appropriate control of the switchable elements SW1 and SW2, activation or deactivation of the first and second trigger elements TR1 and TR2 takes place.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A circuit arrangement for protection against electrostatic discharges comprising:
    a first diverting structure with a first diverting element and a first switchable element;
    a second diverting structure with a second diverting element; and
    a control circuit configured to determine an operating state of the circuit arrangement by evaluating an average potential difference between a first and a second terminal;
    wherein the first diverting element is configured to drain off an electrostatic discharge between the first and the second terminal and comprises an element with a voltage-current characteristic curve that has voltage snapback;
    wherein the first switchable element is adapted to take on a first switching state and a second switching state, with a diverting function of the first diverting element being activated by the first switching state of the first switchable element and deactivated by the second switching state of the first switchable element;
    wherein a series circuit of the first diverting element and the first switchable element connects the first terminal to the second terminal;
    wherein the control circuit is configured to control the relevant switching state of the first switchable element depending on the determined operating state;
    wherein the second diverting element connects the first terminal to the second terminal directly or via a series connection of the second diverting element and a second switchable element, is configured to drain off an electrostatic discharge between the first and the second terminal, and comprises at least one of the following:
    a pnp transistor;

a p-channel field effect transistor;
a Zener diode; or
an element with a voltage-current characteristic curve that does not have voltage snapback; and
wherein the first diverting element and the second diverting element are configured to drain off electrostatic discharge such that the first and second diverting elements do not interact with each other during a respective electrostatic discharge event, and
wherein the first switchable element is a one-time switchable element.

2. The circuit arrangement as in claim 1,
wherein the element with a voltage-current characteristic curve that has voltage snapback comprises at least one of the following:
an npn transistor;
an n-channel field effect transistor; or
a thyristor.

3. The circuit arrangement as in claim 1,
wherein the one-time switchable element is a fuse.

4. The circuit arrangement as in claim 1,
wherein the first diverting structure includes a bypass circuit, which is connected to the first switchable element and connects the first and second terminals via the first switchable element in accordance with a control signal.

5. The circuit arrangement as in claim 1,
wherein the first diverting element has a control input for delivery of a control signal, in accordance with which the first diverting element is conductively controllable.

6. The circuit arrangement as in claim 1,
wherein the first and second terminals are connected via a series circuit of the second diverting element and a second switchable element, and in which the circuit arrangement has a control circuit, which is set up to activate, via control of the first and second switchable elements, in each case one diverting element from among the first and second diverting elements, and in each case to deactivate the other diverting element.

7. The circuit arrangement as in claim 6,
wherein the first and/or the second switchable element comprises a transmission gate or a p-channel field effect transistor.

8. The circuit arrangement as in claim 1,
wherein the first diverting element is designed for chip-level electrostatic discharge protection and the second diverting element is designed for system-level electrostatic discharge protection.

9. A method for operating a circuit arrangement for protection against electrostatic discharges comprising:
providing the circuit arrangement with a first diverting element and a second diverting element, which are each set up to drain off an electrostatic discharge between a first and a second terminal, wherein a series circuit of the first diverting element and a switchable element connects the first terminal to the second terminal, and wherein a diverting function of the second diverting element is permanently activated or becomes activated or deactivated depending on an activation state of a diverting function of the first diverting element;
determining an operating state of the circuit arrangement such that in the determination of the operating state an average potential difference between the first and the second terminals is evaluated; and
activating and/or deactivating of the diverting function of the first diverting element depending on the determined operating state,
wherein said activating and/or deactivating the diverting function of the first diverting element comprises draining off electrostatic discharge such that the first and second diverting elements do not interact with each other during a respective electrostatic discharge event, and
wherein a diverting function of the first diverting element is irreversibly deactivated.

10. The method as in claim 9, wherein the step of activating and/or deactivating takes place via the switchable element, which connects the first terminal to the second terminal in the series circuit with the first diverting element.

11. The method as in claim 9,
wherein the first diverting element is designed for chip-level electrostatic discharge protection and the second diverting element is designed for system-level electrostatic discharge protection.

* * * * *